United States Patent
Sauter et al.

[11] Patent Number: 5,945,750
[45] Date of Patent: *Aug. 31, 1999

[54] STEPPING MOTOR

[75] Inventors: Roland Sauter, Villingen-Schwenningen; Joerg Benz, Niedereschach, both of Germany

[73] Assignee: TRW Fahrzeugelektrik Gmbh & Co. KG, Germany

[ * ] Notice: This patent issued on a continued prosecution application filed under 37 CFR 1.53(d), and is subject to the twenty year patent term provisions of 35 U.S.C. 154(a)(2).

[21] Appl. No.: 08/599,707

[22] Filed: Feb. 12, 1996

[30] Foreign Application Priority Data

Feb. 11, 1995 [DE] Germany ............... 195 04 387

[51] Int. Cl.⁶ ............... H02K 37/00; H02K 7/116
[52] U.S. Cl. ............... 310/49 R; 310/156; 310/40 MM; 310/254; 310/257
[58] Field of Search .............. 310/49 R, 156, 310/162, 179, 254, 40 MM, 216, 163, 165, 194, 198, 257; 368/157, 160, 178, 198

[56] References Cited

U.S. PATENT DOCUMENTS

| | | | |
|---|---|---|---|
| 3,390,289 | 6/1968 | Dijken et al. | 310/42 |
| 3,989,967 | 11/1976 | Kikuyama et al. | 310/112 |
| 4,009,406 | 2/1977 | Inariba | 310/164 |
| 4,048,548 | 9/1977 | Nakajima et al. | 310/40 MM |
| 4,095,130 | 6/1978 | Oshima et al. | 310/162 |
| 4,144,467 | 3/1979 | Nakajima et al. | 310/49 R |
| 4,206,375 | 6/1980 | Sudler | 310/49 R |
| 4,473,766 | 9/1984 | Obergfell et al. | 310/216 |
| 4,528,233 | 7/1985 | Montagu | 310/49 R |
| 4,554,471 | 11/1985 | Bertram et al. | 310/49 R |
| 4,565,955 | 1/1986 | Kubota | 318/696 |
| 4,782,353 | 11/1988 | Ogihara et al. | 310/49 R |
| 5,302,875 | 4/1994 | Taghezout | 310/156 |
| 5,321,330 | 6/1994 | Taghezout | 310/49 R |
| 5,384,506 | 1/1995 | Aoshima | 310/49 R |

FOREIGN PATENT DOCUMENTS

| | | | |
|---|---|---|---|
| 4207978C1 | 3/1992 | Germany | H02K 7/116 |
| 62-163556 | 1/1988 | Japan | H02K 37/16 |
| 63-28256 | 7/1988 | Japan | H02K 37/16 |
| 251352 | 5/1990 | Japan | H02K 37/14 |
| 3207254 | 12/1991 | Japan | H02K 37/16 |
| 4248359 | 1/1993 | Japan | H02K 37/16 |
| 638491 | 5/1994 | Japan | H02K 37/14 |
| 2125992 | 8/1982 | United Kingdom . | |

*Primary Examiner*—Nestor Ramirez
*Assistant Examiner*—Burton S. Mullins
*Attorney, Agent, or Firm*—Fay, Sharpe, Beall, Fagan, Minnich & McKee, LLP

[57] ABSTRACT

Stepping motor comprising a rotor (4) and two, one above the other and with respect to each other angularly offset, stators (2) which are comprised of coils (30) and stator plates (20), wherein the stator plates (20) respectively have a planer U-shaped form with two essentially parallel extending arms (22, 25), the end of arms (22, 25) each exhibits on the inside for the formation of a polar pair an arch shaped recess (23, 26) such that the rotor (4) extending therebetween, in top view, is encompassed along its circumferential segment corresponding to the contour without, however, making contact.

26 Claims, 10 Drawing Sheets ers, lid seated thereupon,
cumulative construction elements, in particular, the stators,

STEPPING MOTOR

BACKGROUND OF THE INVENTION

1. Field of the Invention

The invention concerns a stepping motor for analog display of digitally transmitted values.

2. Description of the Related Art.

This type of stepping motor has attracted a great deal of attention in recent years, particularly in the construction of automobiles, and serves for the analog representation of driving conditions and driver information, wherein digitally measured values, particularly speed, rotations per minute, gas tank volume, oil pressure, etc., are indicated with high resolution. The individual steps must therein be selected to be so small, that the observer cannot recognize these as such, but rather receives the impression of a continuous analog readout. As rule, it is thus preferred to provide the stepping motor with a reduction gear, which translates the angular displacement per step of the rotor in a strongly reduced angular displacement of the drive or, as the case may be, indicator shaft. Conventionally reduction gears with a reduction relationship of 60:1 are employed, which in combination with conventional angular displacements per step provide a sufficient resolution.

In this connection, it is of particular importance, that the step motor is constructed simply and robustly and therewith also economically. Such a stepping motor has been known, for example from DE 42 07 978, which is comprised of two stators which are positioned one above the other and with an angular offset with respect to each other. The stators are herein designed in a shape of a ring and encompass a rotor completely circumferentially, the rotor provided with permanent magnets. The assembly of the completed stepping motor is comparatively simple, since the respective construction elements are successively seated in a housing. Suitable positioning elements adapted to each other insure that the various construction elements are seated in the appropriate orientation. This concerns in particular also the stators, which must indicate the sensed angular displacement.

Disadvantageous herein is the comparatively high expense, which is necessary with respect to the housing and the stators, in order to form the positioning elements. Further, the construction of the two stators has proven itself in particular to be comparatively expensive, since, because of the ring shape of the coils, the stator plate must be specially formed. The coaxial positioning of the two ring shaped stators also results in a relatively high construction height of the stepping motors, which is undesirable for a number of applications. Further, high axial forces occur as a result of this design, causing displacement of the rotor (so-called jumping).

The invention is thus concerned with the problem of providing a stepping motor of the above-described type which no longer exhibits the above-described disadvantages. In particular, a simple construction of a stepping motor should be realized, which makes possible a particularly flat construction.

SUMMARY OF THE INVENTION

The problem is solved by a stepping motor comprising a rotor and two stators, one stator positioned above the other and angularly displaced. The stators are comprised of spools and stator plates. The stator plates are respectively comprised of a planar U-shaped form with two arms extending essentially parallel. The arms each respectively have arcuate recesses for the forming of a polar pair which is so constructed, that the rotor inserted therebetween is, in top view, contour fittingly enveloped along two opposing circumferential segments without, however, making contact.

The invention is based upon the idea that the stator plate should be flat planar and constructed in a U-shaped basic design, so that two parallel extending arms result. The oppositely lying arm ends form a polar pair and encompass the rotor along two cross sectional segments. For the realization of a small as possible of an air gap between the poles and the rotors, arcuate shaped recesses are provided in the arms.

Two such stator plates can be positioned with, for example, a 90° angular off-set with respect to each other, so that in the area of the super positioned arm ends a four polar arrangement is produced. The arch shaped recesses in the arm ends form (in top view) a circular opening, through which the rotor extends with comparatively minimal radial gapping.

The planar construction of the stator plate makes possible an exceptionally flat construction of the step motor. In this way the two stator plates can be positioned one above the other wherein the separation can be less than the thickness of the stator plates themselves, which therefore would no longer represent a limiting factor in the construction of a thin as possible stepping motor. Further, this type of design has the advantage that the axial forces which occur are small and the jumping of the rotor, as discussed above, is practically completely prevented.

As a result of this special design and orientation of the stator plates, the stepping motor possesses an excellent working rate, that it is, it produces a high rotational moment with small current consumption. As a result of the flat construction design, also the axial extension of the rotor is smaller than with conventional stepping motors and thereby the degree of effectiveness is once again improved.

The planar construction also makes possible an exceptionally cost effective production of the stator plates, for example, in the by a one piece stamping which requires no further machining.

The selected configuration also makes it possible to design both stator plates congruent and superposable and to seat them mirror-like. Accordingly only substantially a single stator plate design is necessary.

The magnetic flux is produced by coils, which preferably are respectively shoved over one of the two arms of the stator plate and are there detained. As a result of the U-shape of the stator plates, the spools can be guided without any problem over the respective arm ends and up to the vicinity of the frame member which connects the two arms. It is also possible to use similarly constructed coils for the two stator plates, so that here essentially only a single coil type is necessary.

Particular advantages are provided with a rotor, in which two polar pairs are oriented displaced about 180° and coaxially spaced apart. The coaxial separation corresponds to the separation of the two stator plates, so that respectively one polar pair of the rotor is directed exactly upon the corresponding polar pair formed by the stator plate without height displacement. In this way no axial forces come into existence any longer.

Preferably, the step motor includes a two-part housing with a housing lower part and a lid seated thereupon, wherein the housing lower part is so constructed, that the cumulative construction elements, in particular, the stators, the rotor as well as in certain cases the reduction gear mechanism can be received with positioning. For this purpose pins or pegs, pin or peg receptacles, detente elements and the like are formed on the housing lower part, so that during the assembly of the stepping motor the construction elements are simply inserted and seated upon each other. Further it would be advantageous, that the lid be so constructed, that after attachment to the housing lower part the collective construction elements are fixed. This can be accomplished in a simple means and way, by providing the lid with pin-like projections, abutments, and pin receptacles, so that after the seating with the housing lower part, the collective construction elements are fixed and/or moveably seated. This way then the stepping motor can be assembled without additional fixing materials such as for example, screws or rivets, by a simple interdigitation, which is exceptionally economical. In the converse, there is also now provided the possibility of an exceptionally simple disassembly, in order for example that the stepping motor can be recycled at the end of the use period.

BRIEF DESCRIPTION Of THE DRAWINGS

The invention will be discussed in greater detail with reference to the illustrative examples as shown in the figures. There are shown.

DETAILED DESCRIPTION OF THE INVENTION

Figure 1:
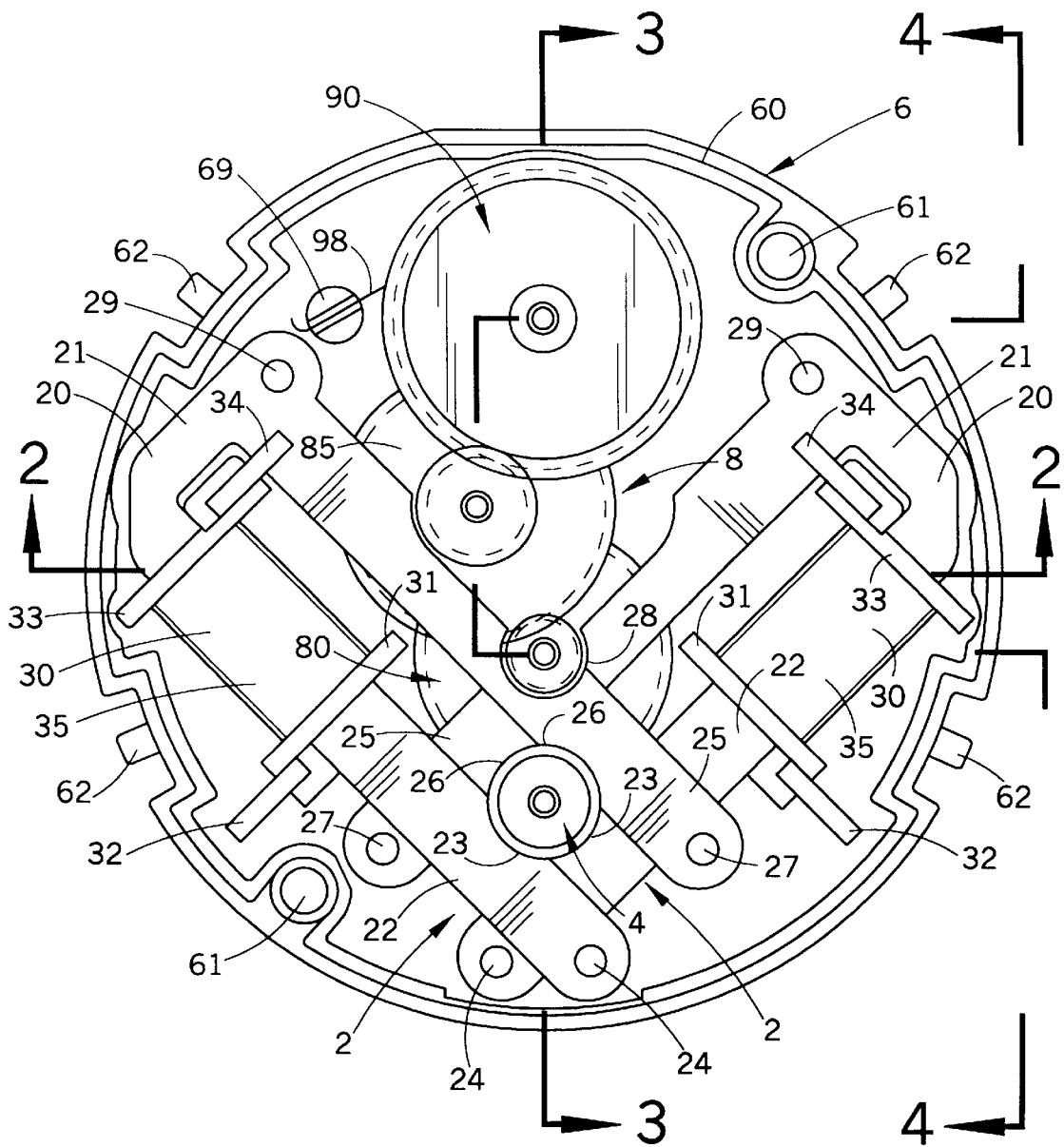
FIG. 1 Top view of a stepping motor with lid removed.

First the invention will be described with respect to the stepping motor as shown in FIGS. 1 through 4. We are concerned here with a two-phase stepping motor in a four-polar design, in which the polar pairs are oriented alternatingly.

The stepping motor is comprised of few main subassemblies, namely, two stators 2, a rotor 4 as well as a reduction gear 8, which is housed within a housing 6, comprised of a housing lower part 60 and a lid 70.

The construction of the stators 2 and their angular displaced orientation with respect to each other of 90° according to the invention is particularly seen from the representation according to FIG. 1. Each of the stators 2 is comprised of a stator plate 20, which is planar and U-shaped. Each of the two stator plates 20 is comprised of two arms 22, 25 which extend essentially parallel to each other, which via a connecting member 21 are formed into a one piece and continuous U-shape. In the end area of the arms 22, 25 arcuate shaped recesses 23, 26 are provided so that the rotor 4 which is inserted through, this area corresponds to this contour and along two oppositely lying circumferential segments is encompassed with radial tolerance. In the planar area of the arm 22, 25 securing holes 24, 27 are provided, which together with a securing hole 29 in the area of the frame member 21 make possible a three point fixing of the stator plate 20.

The arm 25 is includes a cutout section 28 in order to make possible an exceptionally space saving provision of a transmission wheel 80 of the reduction gear 8.

A coil 30 is slid over the arm 22 and secured there in a means and way not shown in detail in the figure. The coil 30 carries a winding 35 which is in communication with the outside via connecting pins 32, 34 and which is held between two cover disks 31, 33.

Both stator plates 20 are constructed to be congruent and superposable and in respect to the section line B—B according to FIG. 1 are provided in mirror symmetric relationship. The angle between the two stator plates 20 is 90° so that in the area of the rotor 4 two polar pairs are produced. The recesses 23, 26 also represent polar pairs, which surround the rotor 4 in the same angular orientation.

Figure 2:
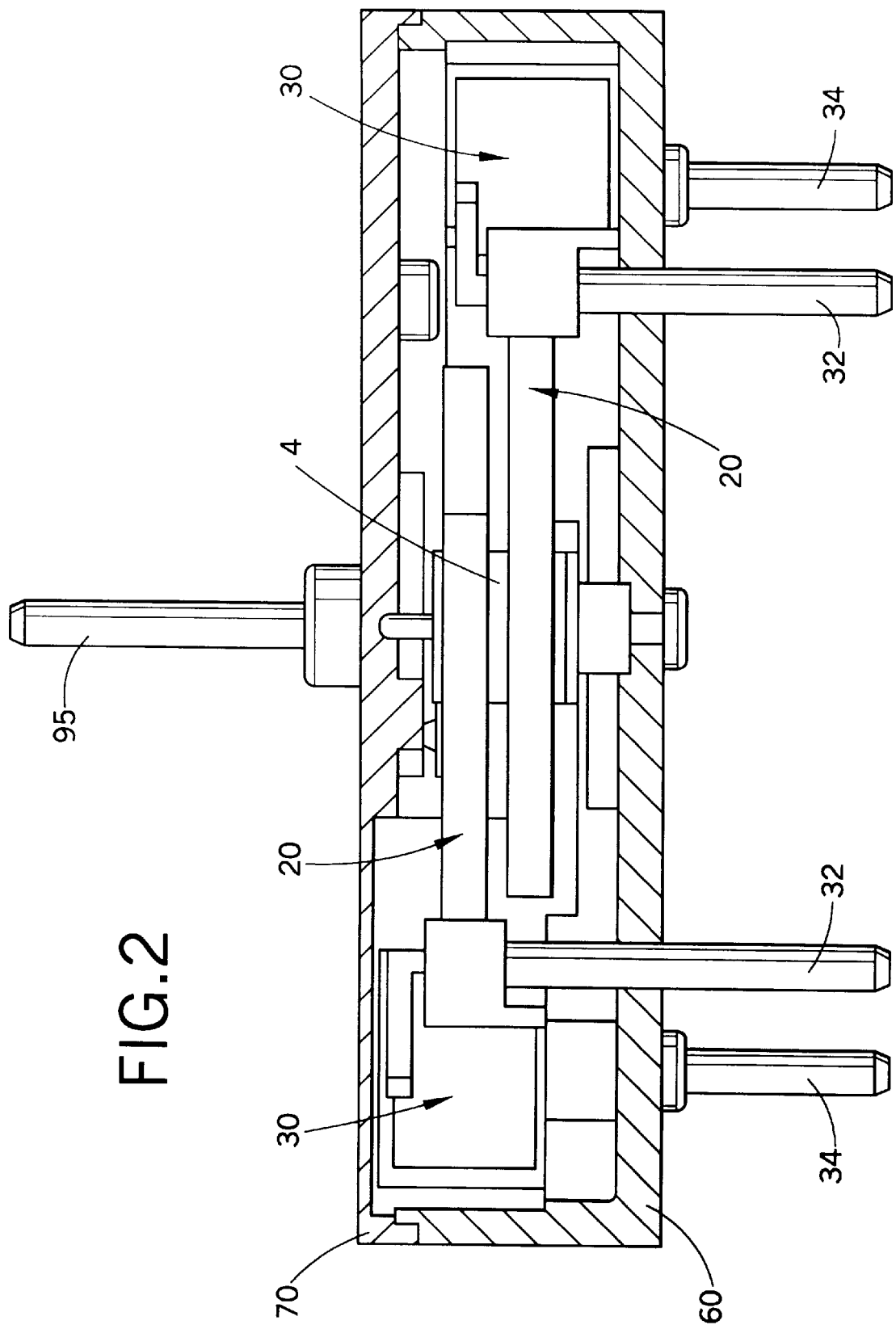
FIG. 2 Cross-section 2—2 according to FIG. 1, housing lower part and lid in section, remaining construction elements not sectioned, FIG. 3 Section 3—3 according to FIG. 1, FIG. 4 Section 4—4 according to FIG. 1, FIGS. 5a–5d Accumulative representation of the views and sectional representations according to FIGS. 1 through 4 of the stepping motor in a slightly modified embodiment, FIG. 5e Detailed representation of a further embodiment, and FIGS. 5f–5i Sectional representation and magnetization curve of the rotor.
Figure 3:
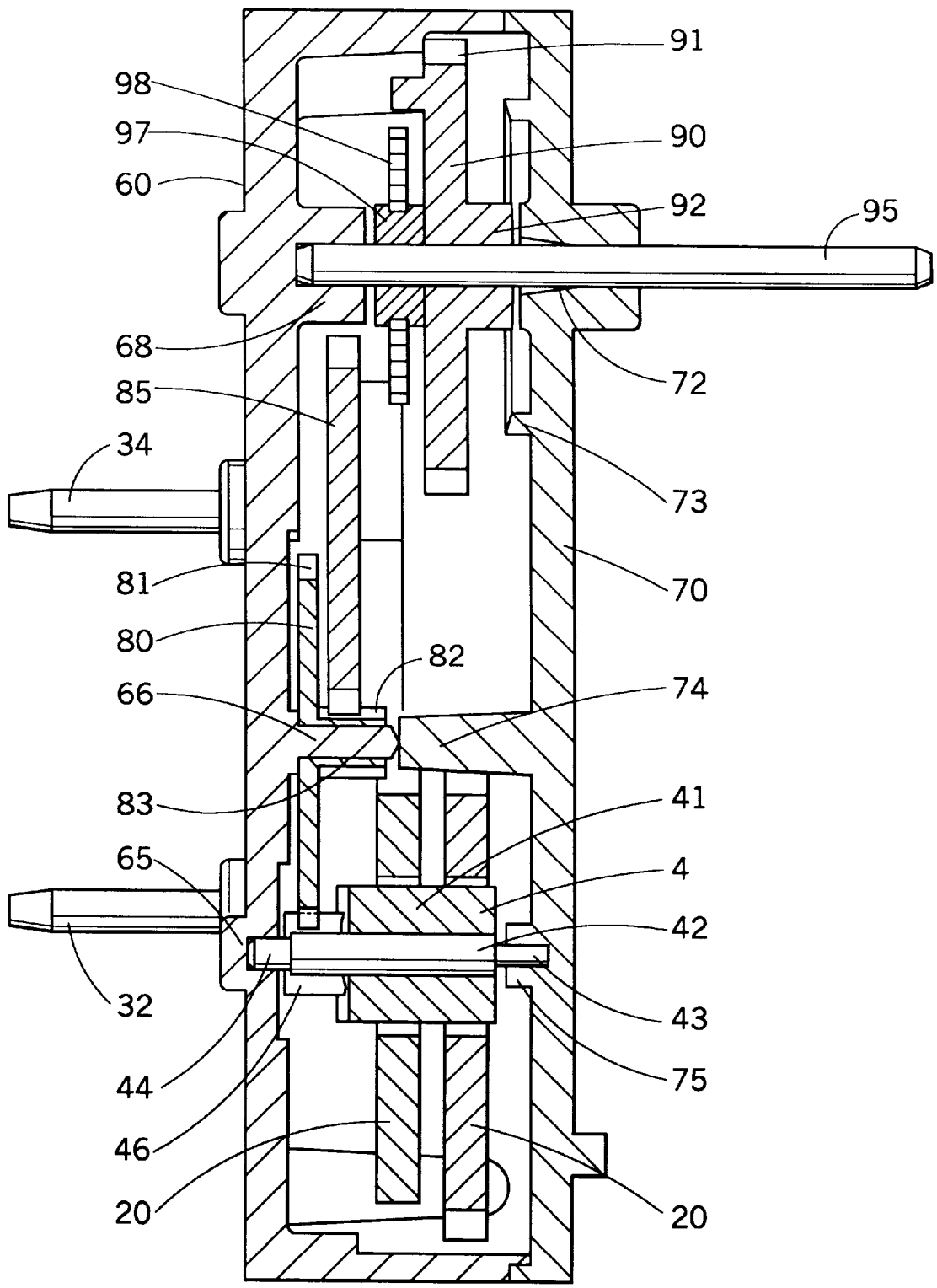
Figure 4:
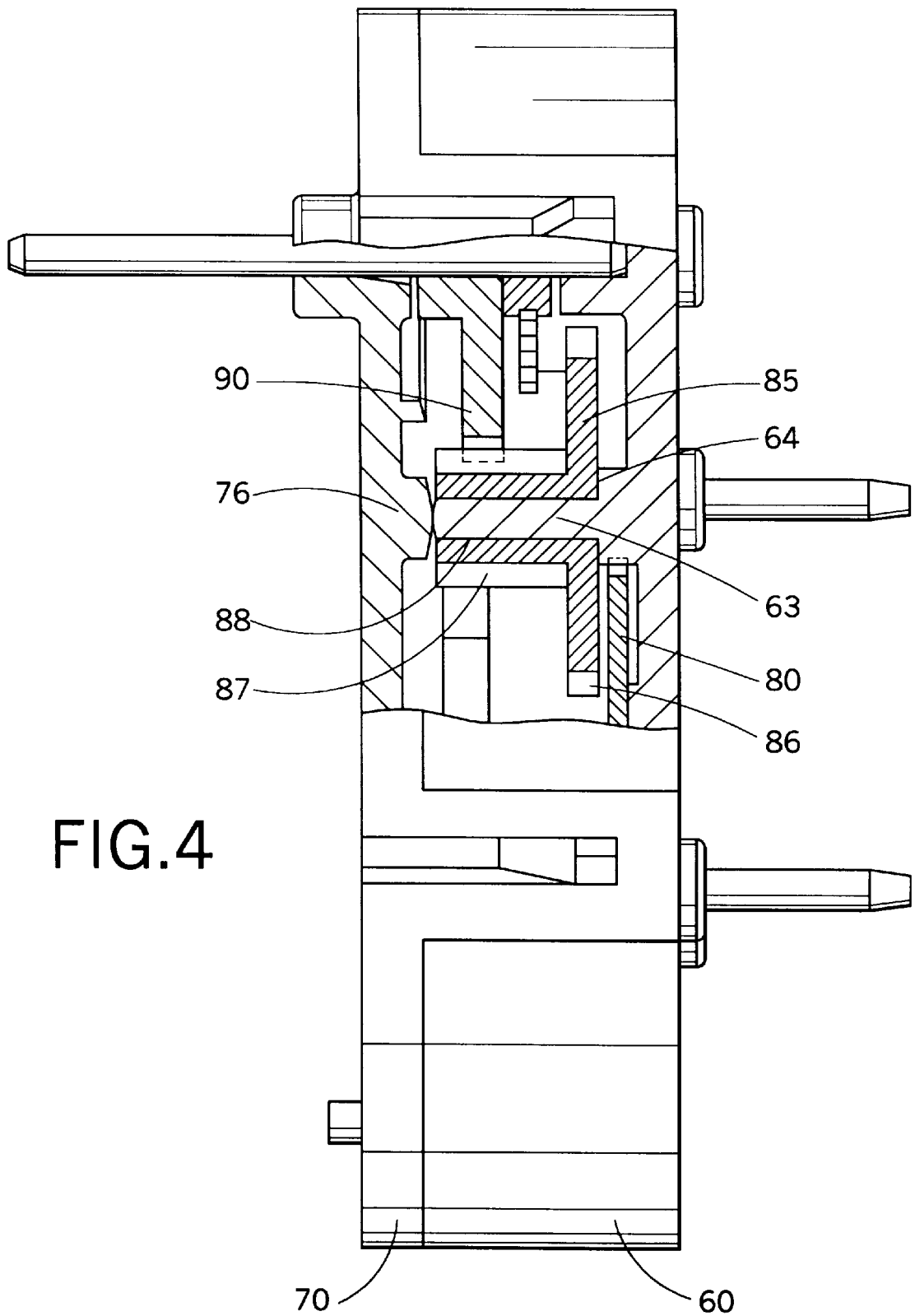

The two stator plates 20 are situated closely one above the other, as seen for example from the FIGS. 2 or 3. The (axial) distance between the two stator plates 20 amounts essentially to a fractional part of the thickness of the stator plates 20, so that the overall stepping motor construction is very flat. The distance between the two stator plates 20 is so selected, that a contacting of the two stator plates 20 is reliably prevented even under extreme working conditions, but on the other hand is otherwise as small as possible.

The rotor 4 includes a permanent magnet 41 of a plastic bonded magnetic material. Respectively two poles are oriented angularly offset 180° with respect to each other and are coaxially spaced, as is to be seen from FIG. 5b. This orientation insures that each stator plate 20 is associated with a polar pair of the rotor 4. Therewith axial forces no longer can occur and a jumping of the rotor is prevented.

The permanent magnet 41 is situated upon a rotor shaft 42 (see FIG. 3), which further carries a drive pinion 46. The rotor shaft 42 terminates at both ends in a mounting pins 43, 44, which are seated in corresponding pin receptacles 65, 75 adapted for receiving the pins. Therewith the rotor 4 is fixed in the axial direction between the housing lower part 60 and the lid 70, but is however rotatably situated.

The rotational movement of the rotor 4 is transmitted over a reduction gear mechanism 8 onto a drive shaft 95. The drive shaft 95 represents for example the indicator shaft of a tachometer. The reduction gear mechanism 8 is set up with a differential relationship of 60:1 so that the desired resolution within a pre-determined angular range of the indicator (for example 300°) is achieved. For realization of the differential relationship two transmission wheels 80, 85 are provided which are engaged between the drive pinion 46 of the rotor 4 and a drive wheel 90 carried on the drive shaft 95. The transmission wheel 80 possesses gear teeth 81, which engage with the drive pinion 46, as well as further gear teeth 82, which are in engagement with the next transmission wheel 85 (FIG. 3). For this purpose the transmission wheel 85 possesses first gear teeth 86 as well as further gear teeth 87, which are in engagement with the gear teeth 91 of the drive wheel 90.

For the realization of a thin as possible construction height of the stepping motor, the positioning of the transmission wheels 80, 85 and the drive wheel 90 are so selected, that the free space in the housing lower part, which is available between the two stators 20, is optimally utilized. The stator plates 20 are thus respectively provided with a cut-out 28, into which on the one side the transmission wheel 80 with its gear teeth 82 carrying axial segment can be introduced. On the other side the support pin 74 provided on the lid 70 can be inserted therethrough from above, which secures the transmission wheel 80 from its face side.

As for the oppositely lying side the transmission wheel 80, this is held by a shoulder type step of a mounting pin 66, which is formed on the housing lower part 60. The mounting pin 66 is dimensioned for to the mounting bore hole 83 which extends through the transmission wheel 80, that no further securing elements are necessary and a simple assembly by insertion of the transmission wheel 80 upon the mounting pin 66 is made possible.

In a similar manner the transmission wheel 85 (see FIG. 4) is mounted. It is provided with a mounting bore hole 88 which is dimensioned exactly for a mounting peg 63. The mounting peg 63 is formed on the housing lower part 60 and is provided with a shoulder 64, which represents an axial stop for the transmission wheel 85 to the housing lower part 60. On the lid side there is also provided a securing pin 76, which serves as an axial securing means.

The drive wheel 90 is mounted in the housing lower part 60 via the drive shaft 95, which engages in a shaft receptacle 68 of the housing lower part 60. Further, the drive wheel 90 possesses an integrated shoulder 92, which is directed at the inner side of the lid. Facing this there is in the lid 70 a through-hole 72 for the drive shaft 95. The through hole 72 is designed with a conical broadening towards the inside of the housing 6, in order to facilitate the insertion of the drive shaft 95 during assembly.

From the above it can be seen that the stepping motor can be simply assembled by the simple assembly of the construction subunits. No special positioning aids are needed hereby, since these are already formed in the housing lower part 60, for example in the form of a mounting pin 63, 66 or the pin receptacles 65, 68. For the fixing of the inserted constructed elements it is essentially only necessary, that the lid 70 is closed upon the housing lower part 60 and so secured. As a result of the positioning and fixing elements in the form of the support pins 74, 76 and pin receptacle 75, the stepping motor is ready for use after assembly. For securing of the lid 70 four securing tabs 62 are formed on the housing lower part 60. Further, the housing lower part 60 is provided two securing through-holes 61, with which the stepping motor can be secured in the installation position.

For avoidance of indication failures or errors, which could arise due to the play in the teeth of the reduction gear mechanism 8, a slack elimination mechanism is provided. This is achieved by means of a pre-tensioned spiral spring 98 which is secured on the one hand to the drive shaft 95 via a fixing element 97 and on the other hand with an holder means 69 formed on the housing lower part 60.

Figure 5A:
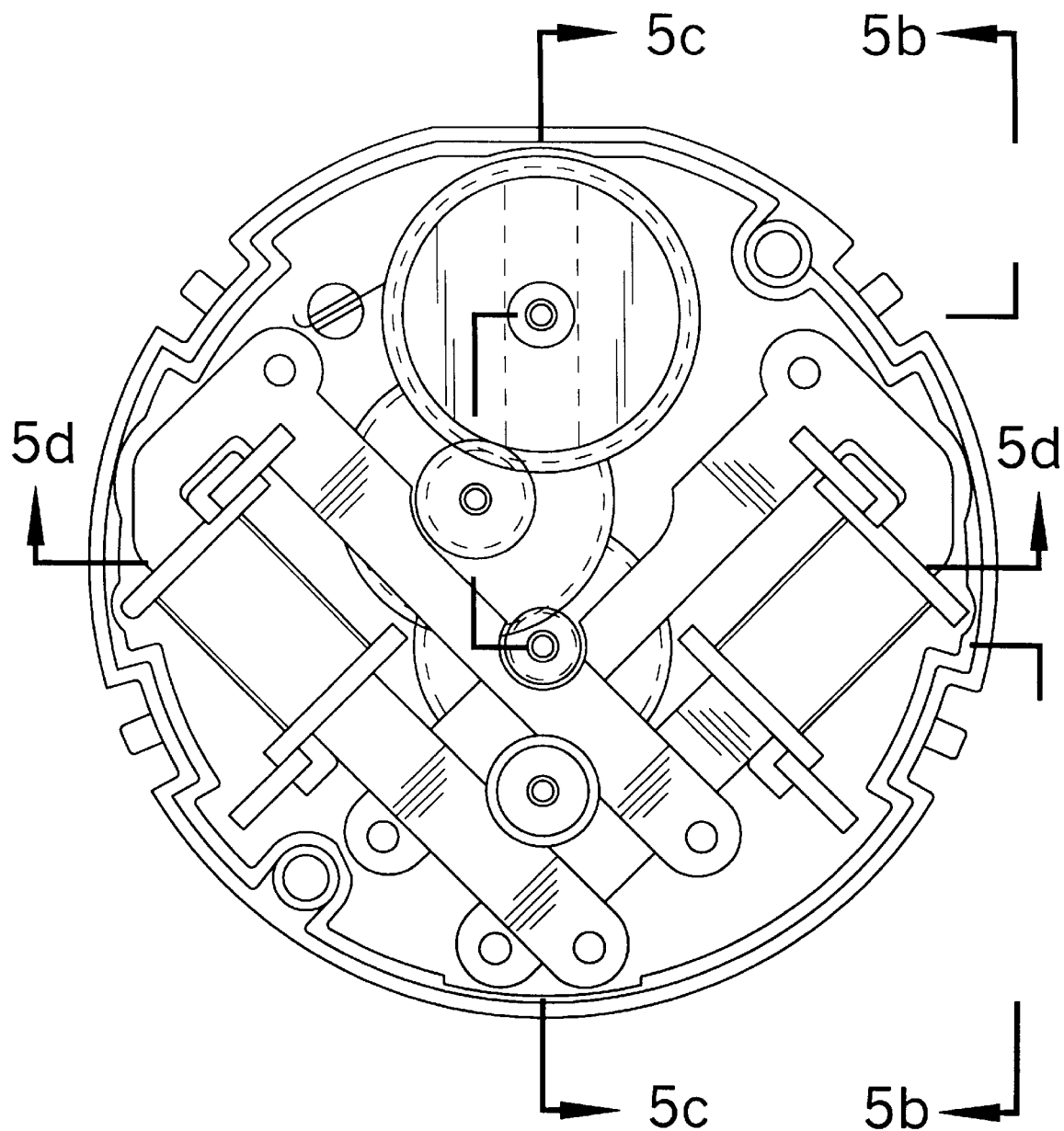
Figure 5B:
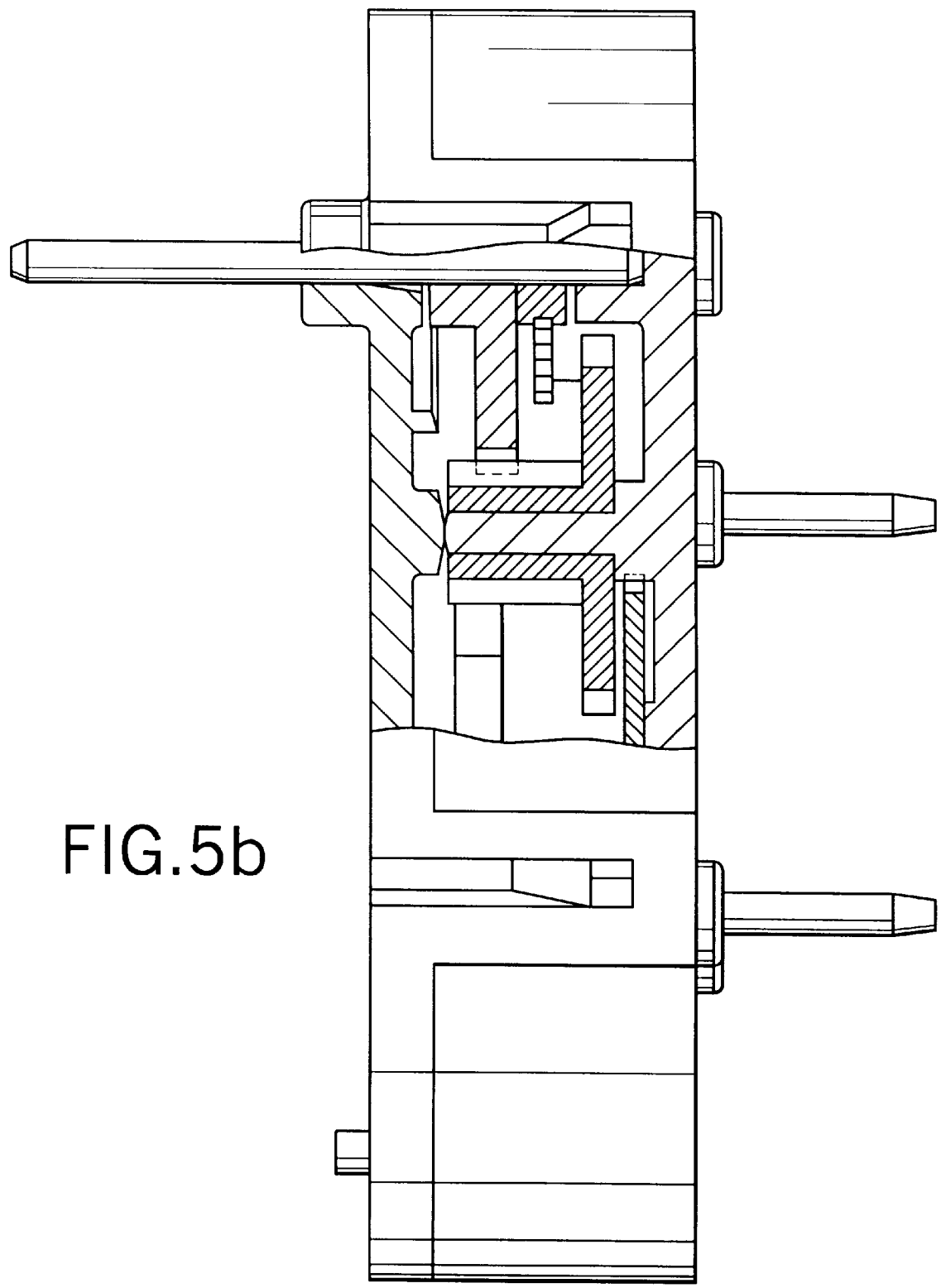
Figure 5C:
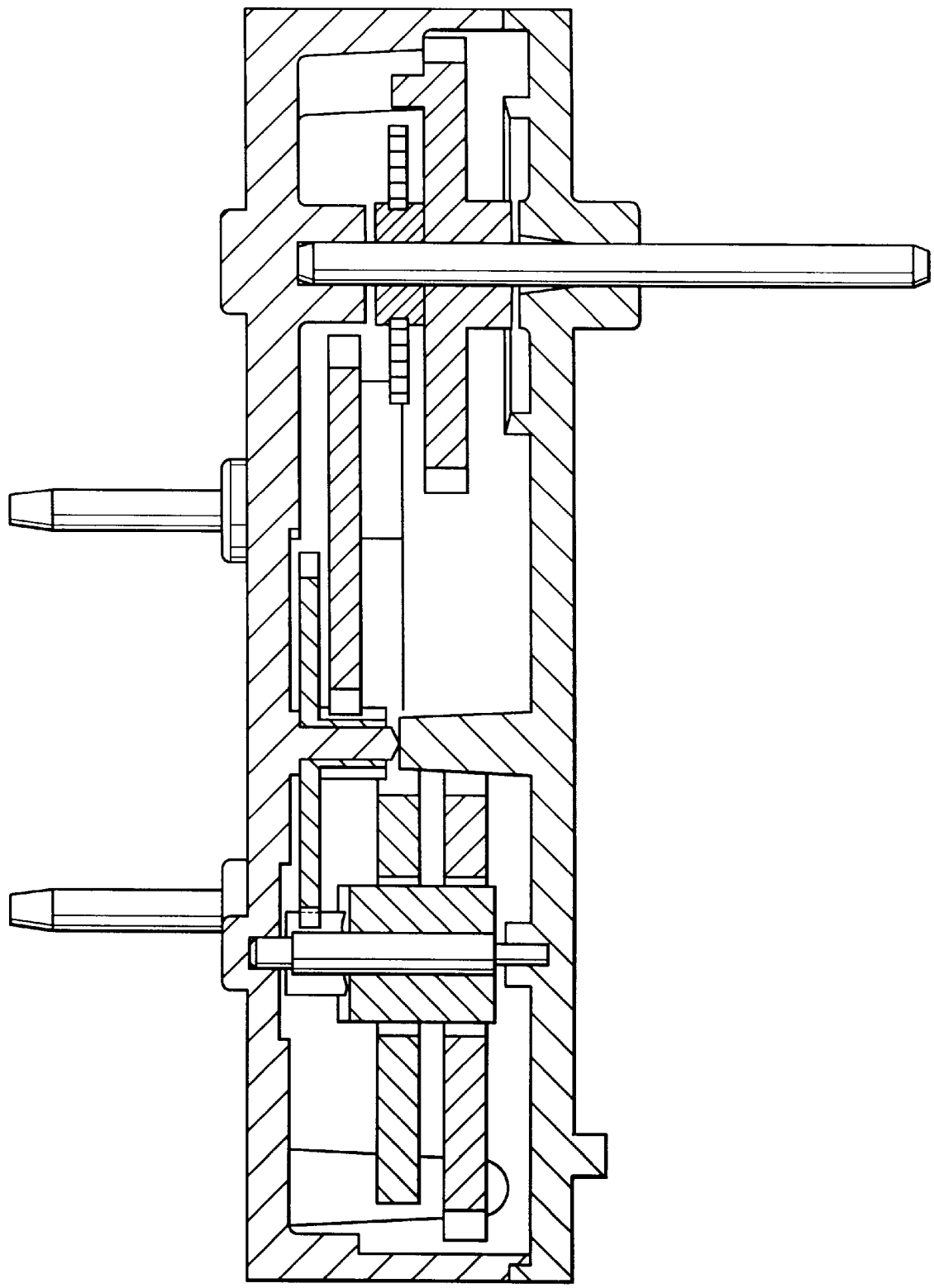
Figure 5D:
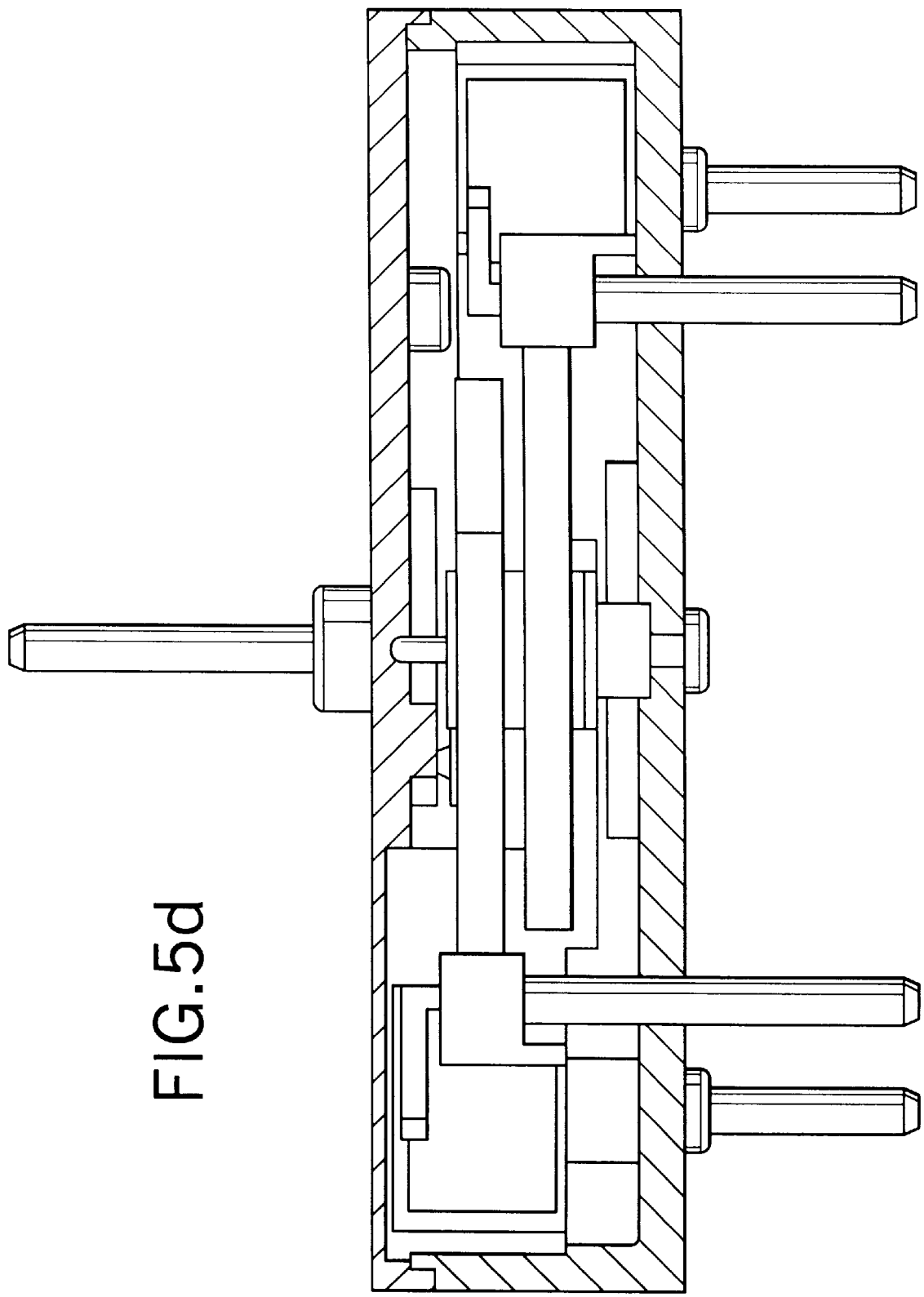
Figure 5E:
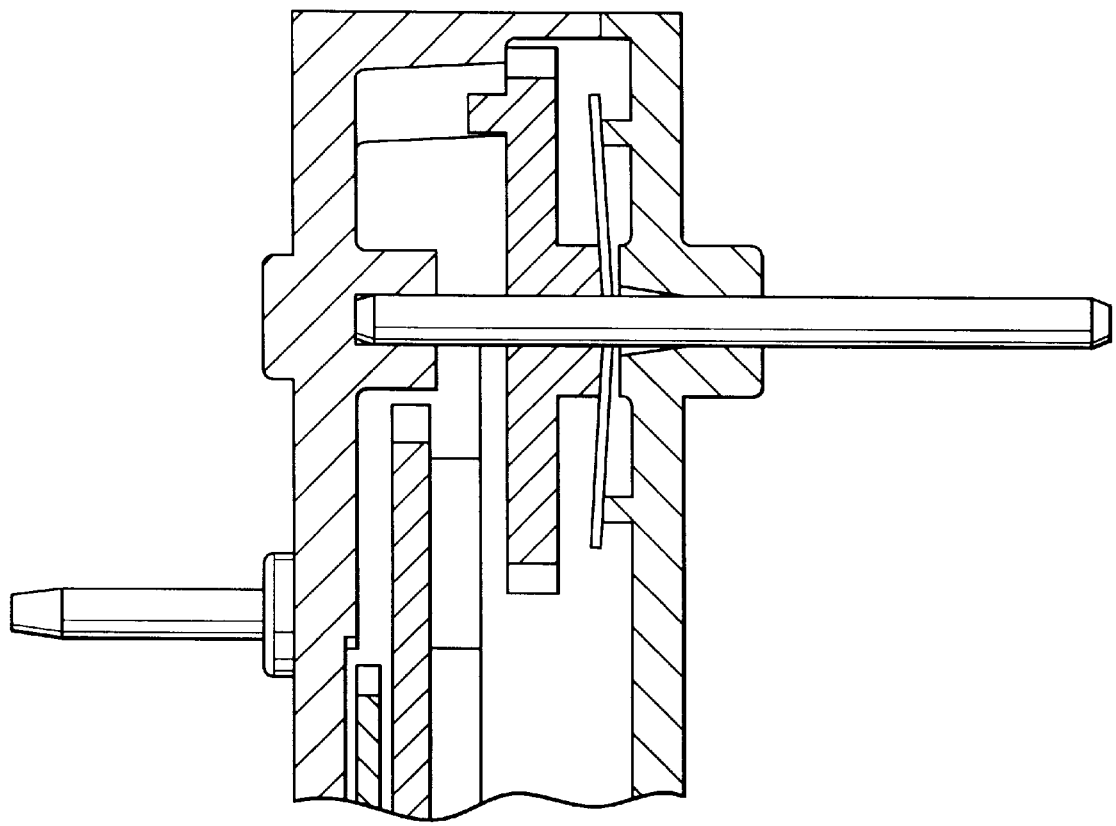
Figure 5G:
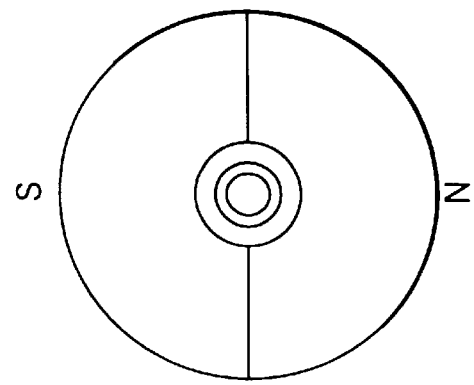
Figure 5I:
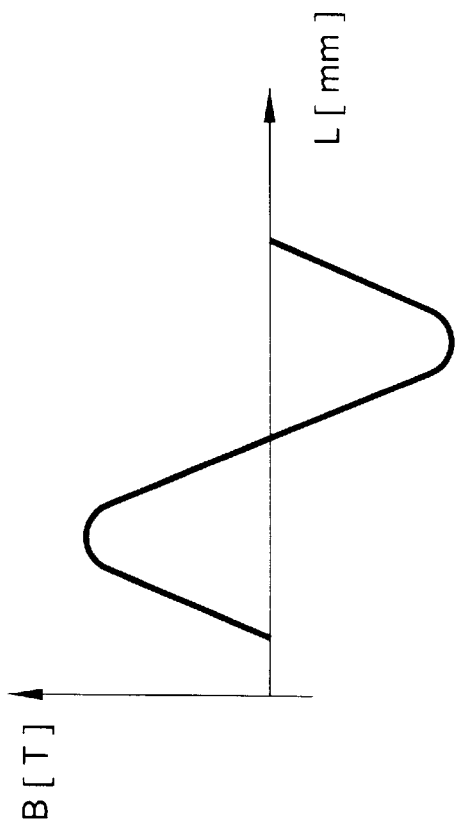
Figure 5F:
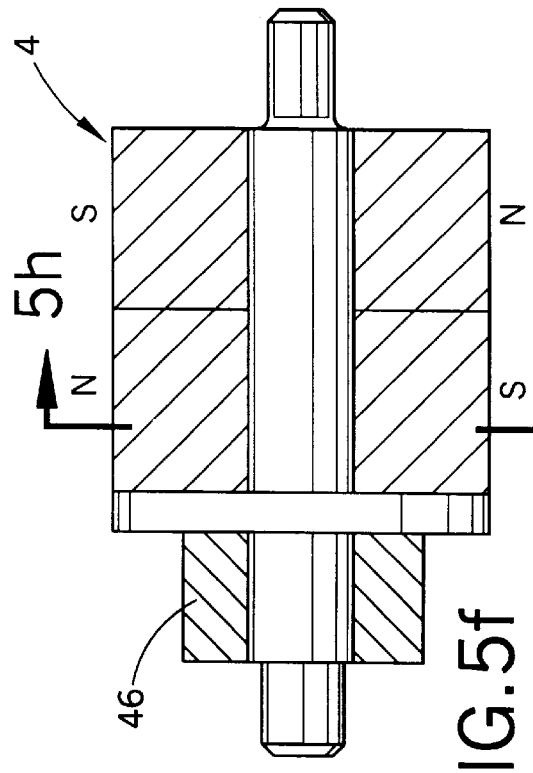
Figure 5H:
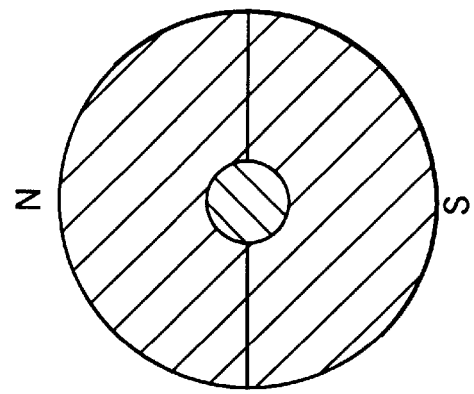

Alternatively (or even additionally) a braking spring 99 can be provided, as shown in FIGS. 5 and 5a.

The braking spring 99 is comprised essentially of an elastic deformable strip, for example of a spring steel strip, which lies upon the shoulder 92 of the drive wheel 90 and is pressed in the direction of the housing lower part 60 by an abutment means 73 formed in the lid 70. As a consequence of the rubbing between the shoulder 92 and the braking spring 99, a desired braking effect is obtained.

The illustrative embodiment represented in FIG. 5a is provided with the braking spring 99 in the place of the tooth wheel equalizing mechanism or as the case may be spiral spring 98, in comparison to which the illustrative embodiment according to FIG. 5 possesses the spiral spring 98 as well as also the braking spring 99.

Aside from the indicated differences, the remaining construction elements of the various illustrative embodiments are the same. Depending upon the desired degree of precision, various conceptions for increasing the indication precision or, as the case may be, quality, may be realized without changing the fundamental construction.

What is claimed is:

1. A stepping motor comprising:

a first coil;

a second coil;

a first substantially planar U-shaped stator disposed in a first plane of the stepping motor including:
  a first connecting member; and,
  a first pair of elongate stator arms extending longitudinally in parallel from said first connecting member and terminating at a first pair of spaced apart free ends, the first pair of elongate stator arms being spaced apart transversely and including a first pair of opposed arcuate recesses therebetween defining a first pair of stepping motor poles at a position on said first pair of stator arms between said first connecting member and said first pair of spaced apart free ends, the first pair of elongate stator arms being adapted to slidably receive the first coil onto at least one free end of said first pair of free ends and carry the first coil between the first connecting member and said at least one free end of said first pair of free ends;

a second substantially planar U-shaped stator disposed in a second plane parallel to and spaced apart from the first plane of the stepping motor including:
  a second connecting member; and,
  a second pair of elongate stator arms extending longitudinally in parallel from said second connecting member in a second direction offset from said first direction by 90° and terminating at a second pair of spaced apart free ends, the second pair of elongate stator arms being spaced apart transversely and including a second pair of opposed arcuate recesses defining a second pair of stepping motor poles at a position on said second pair of stator arms between said second connecting member and said second pair of spaced apart free ends, the first pair of opposed arcuate recesses being located on the first pair of stator arms spaced apart from the first pair of free ends and the second pair of opposed arcuate recesses being located on the second pair of stator arms spaced apart from the second pair of free ends to establish a relative overlap between the first pair of elongate stator arms and the second pair of elongate stator arms, the relative overlap being established with the first pair of spaced apart free ends extending beyond the second pair of elongate stator arms and the second pair of spaced apart free ends extending beyond the first pair of elongate stator arms, the second pair of elongate stator arms being adapted to slidably receive the second coil onto at least one free end of said second pair of free ends and slidably carry the second coil between the second connecting member and said at least one free end of said second pair of free ends; and, a cylindrical rotor member including a pair of coaxially spaced apart polar pairs relatively offset from each other by 180°, a first polar pair of said pair of coaxially spaced apart polar pairs being disposed in said first plane of said stepping motor between said first pair of opposed arcuate recesses and the second polar pair of said pair of coaxially spaced apart polar pairs being disposed in said second plane of said stepping motor between said second pair of opposed arcuate recesses.

2. The stepping motor according to claim 1 wherein an axial distance between said first and second U-shaped stators is less than a thickness of a one of said first and second U-shaped stators.

3. The stepping motor according to claim 1 wherein said first and second U-shaped stators are inversely congruent.

4. The stepping motor according to claim 1 wherein said first and second inversely congruent U-shaped stators are disposed in said stepping motor in a mirror symmetric relationship about an axis intersecting a longitudinal axis of said cylindrical rotor member.

5. The stepping motor according to claim 1 wherein said first and second coils are substantially identically formed.

6. The stepping motor according to claim 1 further comprising a housing including i) a housing lower part adapted to receive and position said first and second U-shaped stators, said rotor member, and a reduction gear mechanism, and ii) a lid adapted for connection to the housing lower part.

7. The stepping motor according to claim 1 wherein said lid is adapted to secure said first and second U-shaped stators, said rotor member, and said reduction gear mechanism within said housing when the lid is connected to said housing lower part.

8. The stepping motor according to claim 1 wherein said rotor member is formed of a plastic bonded magnetic material.

9. A stepping motor comprising:

a first coil;

a second coil;

a first substantially planar U-shaped stator disposed in a first plane of the stepping motor and including:
  a first connecting member; and,
  a first pair of elongate stator arms extending longitudinally in parallel from said first connecting member and terminating at a first pair of spaced apart free ends, the first pair of elongate stator arms being spaced apart transversely and including a first pair of opposed arcuate recesses therebetween located on the first pair of stator arms spaced apart from the first pair of free ends, the first pair of elongate stator arms being adapted to slidably receive the first coil onto at least one free end of said first pair of free ends and carry the first coil between the first connecting member and said at least one free end of said first pair of free ends;

a second substantially planar U-shaped stator disposed in a second plane parallel to and spaced apart from the first plane of the stepping motor including:
  a second connecting member; and,
  a second pair of elongate stator arms extending longitudinally in parallel from said second connecting member in a second direction offset from said first direction by 90° and terminating at a second pair of spaced apart free ends, the second pair of elongate stator arms being spaced apart transversely and including a second pair of opposed arcuate recesses located on the second pair of stator arms spaced apart from the second pair of free ends, the second pair of arcuate recesses defining a second pair of stepping motor poles at a position on said second pair of stator arms between said second connecting member and said second pair of spaced apart free ends, the second pair of elongate stator arms being adapted to slidably receive the second coil onto at least one free end of said second pair of free ends and slidably carry the second coil between the second connecting member and said at least one free end of said second pair of free ends, the first pair of opposed arcuate recesses being located on the first pair of stator arms spaced apart from the first pair of free ends and the second pair of opposed arcuate recesses being located on the second pair of stator arms spaced apart from the second pair of free ends to establish a relative overlap between the first pair of elongate stator arms and the second pair of elongate stator arms, wherein said relative overlap between said first pair of elongate stator arms and said second pair of elongate stator arms is established with said first pair of spaced apart free ends extending beyond said second pair of elongate stator arms and said second pair of spaced apart free ends extending beyond said first pair of elongate stator arms; and, a cylindrical rotor member including a pair of coaxially spaced apart polar pairs, a first polar pair of said pair of coaxially spaced apart polar pairs being disposed in said first plane of said stepping motor between said first pair of opposed arcuate recesses and the second polar pair of said pair of coaxially spaced apart polar pairs being disposed in said second plane of said stepping motor between said second pair of opposed arcuate recesses.

10. A stepping motor comprising:

a first coil;

a second coil;

a first substantially planar U-shaped stator disposed in a first plane of the stepping motor and including:
  a first connecting member; and,
  a first pair of elongate stator arms extending longitudinally in parallel from said first connecting member and terminating at a first pair of spaced apart free ends, the first pair of elongate stator arms being spaced apart transversely and including a first pair of opposed arcuate recesses therebetween located on the first pair of stator arms spaced apart from the first pair of free ends, the first pair of elongate stator arms being adapted to slidably receive the first coil onto at least one free end of said first pair of free ends and carry the first coil between the first connecting member and said at least one free end of said first pair of free ends;

a second substantially planar U-shaped stator disposed in a second plane parallel to and spaced apart from the first plane of the stepping motor including:
  a second connecting member; and,
  a second pair of elongate stator arms extending longitudinally in parallel from said second connecting member in a second direction offset from said first direction by 90° and terminating at a second pair of spaced apart free ends, the second pair of elongate stator arms being spaced apart transversely and including a second pair of opposed arcuate recesses located on the second pair of stator arms spaced apart from the second pair of free ends, the second pair of arcuate recesses defining a second pair of stepping motor poles at a position on said second pair of stator arms between said second connecting member and said second pair of spaced apart free ends, the second pair of elongate stator arms being adapted to slidably receive the second coil onto at least one free end of said second pair of free ends and slidably carry the second coil between the second connecting member and said at least one free end of said second pair of free ends, the first pair of opposed arcuate recesses being located on the first pair of stator arms spaced apart from the first pair of free ends and the second pair of opposed arcuate recesses being located on the second pair of stator arms spaced apart from the second pair of free ends to establish a relative overlap between the first pair of elongate stator arms and the second pair of elongate stator arms; and, a cylindrical rotor member including a pair of coaxially spaced apart polar pairs, a first polar pair of said pair of coaxially spaced apart polar pairs being disposed in said first plane of said stepping motor between said first pair of opposed arcuate recesses and the second polar pair of said pair of coaxially spaced apart polar pairs being disposed in said second plane of said stepping motor between said second pair of opposed arcuate recesses, the coaxially spaced apart polar pairs of said cylindrical rotor member being relatively angularly offset from each other by 180°.

11. A stepping motor comprising:

a first coil;

a second coil;

a first substantially planar U-shaped stator disposed in a first plane of the stepping motor and including:
   a first connecting member; and,
   a first pair of elongate stator arms extending longitudinally in parallel from said first connecting member and terminating at a first pair of spaced apart free ends, the first pair of elongate stator arms being spaced apart transversely and including a first pair of opposed arcuate recesses therebetween defining a first pair of stepping motor poles at a position on said first pair of stator arms between said first connecting member and said first pair of spaced apart free ends, the first pair of elongate stator arms being adapted to slidably receive the first coil onto at least one free end of said first pair of free ends and carry the first coil between the first connecting member and said at least one free end of said first pair of free ends;

a second substantially planar U-shaped stator disposed in a second plane parallel to and spaced apart from the first plane of the stepping motor including:
   a second connecting member; and,
   a second pair of elongate stator arms extending longitudinally in parallel from said second connecting member in a second direction offset from said first direction by 90° and terminating at a second pair of spaced apart free ends, the second pair of elongate stator arms being spaced apart transversely and including a second pair of opposed arcuate recesses defining a second pair of stepping motor poles at a position on said second pair of stator arms between said second connecting member and said second pair of spaced apart free ends, the first pair of opposed arcuate recesses being located on the first pair of stator arms spaced apart from the first pair of free ends and the second pair of opposed arcuate recesses being located on the second pair of stator arms spaced apart from the second pair of free ends to establish a relative overlap between the first pair of elongate stator arms and the second pair of elongate stator arms, the relative overlap being established with the first pair of spaced apart free ends extending beyond the second pair of elongate stator arms and the second pair of spaced apart free ends extending beyond the first pair of elongate stator arms, the second pair of elongate stator arms being adapted to slidably receive the second coil onto at least one free end of said second pair of free ends and slidably carry the second coil between the second connecting member and said at least one free end of said second pair of free ends; and, a cylindrical rotor member including a pair of coaxially spaced apart polar pairs, a first polar pair of said pair of coaxially spaced apart polar pairs being disposed in said first plane of said stepping motor between said first pair of opposed arcuate recesses and the second polar pair of said pair of coaxially spaced apart polar pairs being disposed in said second plane of said stepping motor between said second pair of opposed arcuate recesses.

12. The stepping motor according to claim 11 wherein an axial distance between said first and second U-shaped stators is less than a thickness of a one of said first and second U-shaped stators.

13. The stepping motor according to claim 11 wherein said first and second U-shaped stators are inversely congruent.

14. The stepping motor according to claim 13 wherein said first and second inversely congruent U-shaped stators are disposed in said stepping motor in a mirror symmetric relationship about an axis intersecting a longitudinal axis of said cylindrical rotor member.

15. The stepping motor according to claim 11 wherein said first and second coils are substantially identically formed.

16. The stepping motor according to claim 11 further comprising a housing including i) a housing lower part adapted to receive and position said first and second U-shaped stators, said rotor member, and a reduction gear mechanism, and ii) a lid adapted for connection to the housing lower part.

17. The stepping motor according to claim 16 wherein said lid is adapted to secure said first and second U-shaped stators, said rotor member, and said reduction gear mechanism within said housing when the lid is connected to said housing lower part.

18. The stepping motor according to claim 11 wherein said rotor member is formed of a plastic bonded magnetic material.

19. A stepping motor comprising:

a first coil;

a second coil;

a first substantially planar U-shaped stator disposed in a first plane of the stepping motor and including:
   a first connecting member; and,
   a first pair of elongate stator arms extending longitudinally in parallel from said first connecting member and terminating at a first pair of spaced apart free ends, the first pair of elongate stator arms being spaced apart transversely and including a first pair of opposed arcuate recesses therebetween defining a first pair of stepping motor poles at a position on said first pair of stator arms between said first connecting member and said first pair of spaced apart free ends, the first pair of elongate stator arms being adapted to slidably receive the first coil onto at least one free end of said first pair of free ends and carry the first coil between the first connecting member and said at least one free end of said first pair of free ends;

a second substantially planar U-shaped stator disposed in a second plane parallel to and spaced apart from the first plane of the stepping motor including:

a second connecting member; and, a second pair of elongate stator arms extending longitudinally in parallel from said second connecting member in a second direction offset from said first direction by 90° and terminating at a second pair of spaced apart free ends, the second pair of elongate stator arms being spaced apart transversely and including a second pair of opposed arcuate recesses defining a second pair of stepping motor poles at a position on said second pair of stator arms between said second connecting member and said second pair of spaced apart free ends, the second pair of elongate stator arms being adapted to slidably receive the second coil onto at least one free end of said second pair of free ends and slidably carry the second coil between the second connecting member and said at least one free end of said second pair of free ends; and, a cylindrical rotor member including a pair of coaxially spaced apart polar pairs relatively offset from each other by 180°, a first polar pair of said pair of coaxially spaced apart polar pairs being disposed in said first plane of said stepping motor between said first pair of opposed arcuate recesses and the second polar pair of said pair of coaxially spaced apart polar pairs being disposed in said second plane of said stepping motor between said second pair of opposed arcuate recesses.

20. The stepping motor according to claim 19 wherein an axial distance between said first and second U-shaped stators is less than a thickness of a one of said first and second U-shaped stators.

21. The stepping motor according to claim 19 wherein said first and second U-shaped stators are inversely congruent.

22. The stepping motor according to claim 21 wherein said first and second inversely congruent U-shaped stators are disposed in said stepping motor in a mirror symmetric relationship about an axis intersecting a longitudinal axis of said cylindrical rotor member.

23. The stepping motor according to claim 19 wherein said first and second coils are substantially identically formed.

24. The stepping motor according to claim 19 further comprising a housing including i) a housing lower part adapted to receive and position said first and second U-shaped stators, said rotor member, and a reduction gear mechanism, and ii) a lid adapted for connection to the housing lower part.

25. The stepping motor according to claim 24 wherein said lid is adapted to secure said first and second U-shaped stators, said rotor member, and said 15 reduction gear mechanism within said housing when the lid is connected to said housing lower part.

26. The stepping motor according to claim 19 wherein said rotor member is formed of a plastic bonded magnetic material.

* * * * *